(12) United States Patent
 Faehler et al.

(10) Patent No.: US 8,786,276 B2
(45) Date of Patent: Jul. 22, 2014

(54) CONSTRUCTION ELEMENT MADE OF A FERROMAGNETIC SHAPE MEMORY MATERIAL AND USE THEREOF

(75) Inventors: Sebastian Faehler, Dresden (DE); Michael Thomas, Dresden (DE); Oleg Heczko, Prague (CZ); Joerg Buschbeck, Goleta, CA (US); Jeffrey McCord, Dresden (DE)

(73) Assignee: Leibniz-Institut fuer Festkoerper-und Werkstoffforschung Dresden E.V., Dresden (DE)

( * ) Notice: Subject to any disclaimer, the term of this patent is extended or adjusted under 35 U.S.C. 154(b) by 626 days.

(21) Appl. No.: 12/995,618

(22) PCT Filed: Jun. 2, 2009

(86) PCT No.: PCT/EP2009/056739
§ 371 (c)(1),
(2), (4) Date: Feb. 22, 2011

(87) PCT Pub. No.: WO2009/147135
PCT Pub. Date: Dec. 10, 2009

(65) Prior Publication Data
US 2011/0163745 A1    Jul. 7, 2011

(30) Foreign Application Priority Data
Jun. 2, 2008   (DE) .......................... 10 2008 026 297

(51) Int. Cl.
*G01R 33/02* (2006.01)
(52) U.S. Cl.
USPC ........................................................ 324/244
(58) Field of Classification Search
USPC ........................................................ 324/244
See application file for complete search history.

(56) References Cited

U.S. PATENT DOCUMENTS

| 6,214,244 B1 | 4/2001 | Silverbrook |
| 6,251,298 B1 | 6/2001 | Silverbrook |

(Continued)

FOREIGN PATENT DOCUMENTS

| CN | 1 501 410 | 6/2004 |
| CN | 101 078 082 | 11/2007 |

(Continued)

OTHER PUBLICATIONS

Frazier et al., "Uses of Electroplated Aluminum for the Development of Microstructures and Micromachining Processes", Journal of Microelectromechanical Systems, Jun. 1997, pp. 8.

(Continued)

*Primary Examiner* — Bot Ledynh
(74) *Attorney, Agent, or Firm* — Greenblum & Bernstein, P.L.C.

(57) ABSTRACT

The invention relates to the field of materials science and relates to a component, which can be used, for example, for microcomponents, microsensors and microactuators. The object of the present invention is to disclose a component in which a clearly greater relative length change occurs. The object is attained through a component of a ferromagnetic shape memory material, produced by a method in which at least one sacrificial layer is applied onto a single-crystalline or biaxially textured substrate, onto which sacrificial layer an epitaxial or textured layer of a ferromagnetic shape memory material with a layer thickness of ≤50 µm is applied, subsequently the sacrificial layer is removed at least partially, and during or after the layer application a structuring at least of the ferromagnetic shape memory material is realized such that an aspect ratio is achieved in which at least one length is greater by at least a factor of 3 than the thickness of the layer or the shortest dimension of the component.

32 Claims, 4 Drawing Sheets

(56) References Cited

U.S. PATENT DOCUMENTS

| | | | |
|---|---|---|---|
| 6,515,382 | B1 | 2/2003 | Ullakko |
| 6,903,404 | B2* | 6/2005 | Kim ............................... 257/304 |
| 7,142,341 | B2 | 11/2006 | Kohl et al. |
| 2006/0115919 | A1 | 6/2006 | Gogoi et al. |
| 2006/0162331 | A1 | 7/2006 | Kirkpatirck et al. |
| 2008/0144364 | A1* | 6/2008 | Lee et al. ..................... 365/164 |

FOREIGN PATENT DOCUMENTS

| | | |
|---|---|---|
| EP | 0 866 142 | 9/1998 |
| EP | 1 630 416 | 3/2006 |
| JP | 11-103076 | 4/1999 |
| JP | 11-220135 | 8/1999 |
| WO | 97/03472 | 1/1997 |
| WO | 98/08261 | 2/1998 |
| WO | 02/064847 | 8/2002 |
| WO | 03/078922 | 9/2006 |

OTHER PUBLICATIONS

Maciossek et al., "Galvanoplating and sacrificial layers for surface micromachining", Microelectronic Engineering, 1995, pp. 6.

Bhattacharya et al., "Crystal symmetry and the reversibility of martensitic transformations", letters to nature, 2004, pp. 5.

Boonyongmaneerat et al., "Increasing Magnetoplasticity in Polycrystalline Ni—Mn—Ga by Reducing Internal Constraints through Porosity", Physical Review Letters, Dec. 10, 2007, pp. 4.

Buschbeck et al., "Growth structure and texture of epitaxial Fe100-xPdx films deposited on MgO 100 at room temperature: An x-ray diffraction study", Physical Review B, Nov. 15, 2007, pp. 8.

Leith et al., "In-situ fabrication of sacrificial layers in electrodeposited NiFe microstructures", Journal of Micromech. Microeng., Feb. 9, 1999, pp. 9.

Scheerbaum et al., "Textured polymer bonded composites with Ni-Mn-Ga magnetic shape memory particles", Acta Materialia, Feb. 20, 2007, pp. 7.

Sozinov et al., "Giant magnetic-field-induced strain in NiMnGa seven-layered martensitic phase", Applied Physics Letters, Mar. 11, 2002, pp. 3.

Bell et al., "Porous silicon as a sacrificial material", Journal of Micromech. Microeng., Nov. 4, 1996, pp. 10.

Takeuchi et al., "Identification of novel compositions of ferromagnetic shape-memory alloys using composition spreads", Nature, Feb. 2, 2003, pp. 5.

Thomas et al., "Magnetically induced reorientation of martensite variants in constrained epitaxial Ni—Mn—Ga films grown on MgO(001)", New Journal of Physics, Feb. 25, 2008, pp. 21.

Ullakko et al., "Large magnetic-field-induced strains in Ni2MnGa single crystals", Applied Physics Letters, Sep. 23, 1996, pp. 3.

Vasil'ev et al., "Shape memory ferromagnets", Physics—Uspekhi, 2003, pp. 31.

Jakob et al., "Epitaxial films of the magnetic shape memory material Ni2MnGa", Journal of Magnetism and Magnetic Materials, Nov. 21, 2006, pp. 3.

Krenke et al., "Inverse magnetocaloric effect in ferromagnetic Ni—Mn—Sn alloys", Nature, 2005, pp. 12.

Jakob et al., "Correlation of electronic structure and martensitic transition in epitaxial Ni2MnGa films", Physical Review B, Nov. 2, 2007, pp. 6.

Kainuma et al., "Magnetic-field-induced shape recovery by reverse phase transformation", Nature Letters, Feb. 23, 2006, pp. 4.

Lavrov et al., "Magnetic shape-memory effects in a crystal", Nature, Jul. 25, 2002, pp. 3.

Lee et al., "_Improvement of the surface characteristics of sputtered metal layer for a MEMS micro-mirror switch", Thin Solid Films, 2004, pp. 4.

Murray et al., "Model for discontinuous actuation of ferromagnetic shape memory alloy under stress", Journal of Applied Physics, Jan. 15, 2001, pp. 7.

Ohtsuka et al., "Magnetic-field induced shape memory effect in Ni2MnGa sputtered films", Materials Science and Engineering A, Oct. 28, 2003, pp. 7.

Otsuka et al., "Shape Memory Materials", Cambridge University Press, 1998, pp. 2.

Wurz et al., "Fabrication of a micro coil for magnetooptical storage", IEEE Transactions on Magnetics, Oct. 2006, pp. 3.

Cherechukin et al., "Shape memory effect due to magnetic field-induced thermoelastic martensitic transformation in polycrystalline Ni—Mn—Fe—Ga alloy", Physics Letters A, Sep. 26, 2001, pp. 9.

Dong et al., "Shape memory and ferromagnetic shape memory effects in single-chystal Ni2MnGa thin films", Journal of applied Physics, Mar. 1, 2004, pp. 8.

Dong et al., "Molecular beam epitaxy growth of ferromagnetic single crystal (001) Ni2MnGa on (001) GaAs", Applied Physics Letters, Sep. 6, 1999, pp. 3.

Kim et al., "Air gap type thin film bulk acoustic resonator fabrication using simplified process", Thin Solid Films, Oct. 26, 2005, pp. 5.

Heczko et al., "Epitaxial Ni—Mn—Ga films deposited on SrTiO3 and evidence of magnetically induced reorientation of martensitic variants at room temperature", Applied Physics Letters, Feb. 21, 2008, pp. 3.

Liu et al., "Martensitic transformation and shape memory effect in ferromagnetic Heusler alloy Ni2FeGa," *Applied Physics Letters, AIP, American Institute of Physics,* vol. 82, No. 3, pp. 424-426, XP012034592, ISSN 0003-6951 (Jan. 20, 1993).

Zheng et al., "Martensitic transformation of Ni-Fe-Ga-(Co, Ag) magnetic shape memory alloys," *Journal of Alloys and Compounds,* vol. 387, No. 1-2, pp. 265-268, XP025330067, ISSN 0925-8388 (Jan. 5, 2005).

O'Handley, "Modern Magnetic Materials—Principles and Applications", Wiley-Interscience Publication, 2000, pp. 38-43.

Hubert et al., "Magnetic Domains: The Analysis of Magnetic Microstructures," Springer-Verlag 1998, pp. 306-315.

Hakola et al., "Substrate-free Structures of Iron-doped Ni-Mn-Ga Thin Films Prepared by Pulsed Laser Deposition," *Journal of Physics* Conference Series 59, 122-125 (2007).

\* cited by examiner

CONSTRUCTION ELEMENT MADE OF A FERROMAGNETIC SHAPE MEMORY MATERIAL AND USE THEREOF

CROSS-REFERENCE TO RELATED APPLICATIONS

The present application is a U.S. National Stage of International Patent Application No. PCT/EP2009/056739 filed Jun. 2, 2009 which published as WO 2009/147135 on Dec. 10, 2009, and claims priority of German Patent Application No. 10 2008 026 297.8 filed Jun. 2, 2008.

BACKGROUND OF THE INVENTION

1. Field of the Invention

The invention relates to the field of materials sciences and relates to a component of a ferromagnetic shape memory material which can be used, for example, for microsystems, microsensors and microactuators.

2. Discussion of Background Information

Since the discovery of magnetic shape memory alloys [Ullakko, K. et al.: Appl. Phys. Lett. 69 (13), 1966 (1996)] it has been possible to achieve large strains of up to 10% in Ni—Mn—Ga single crystals in a magnetic field by reorienting the crystal structure [Sozinov, A., et al.: Appl. Phys. Lett. 80 (10), 1746 92002)]. The magnetic field strength necessary for this purpose is less than 1 T.

This discovery led to intensive research into new compositions of Ni—Mn—Ga [Takeuchi, I. et al.: Nature Materials 2, 180 (2003)] as well as other new materials, such as Ni—Mn—In [Lavrov, A., et al.: Nature 418 (6896), 385 (2002); Kainuma, R. et al.: Nature 439, 957 (2006)]. New preparation methods, such as foam [Boonyongmaneerat, Y., et al.: Phys. Rev. Lett. 99, 247201 (2007)] or composites [Scheerbaum, N., et al.: Acta Mat. 55, 2707 (2007)] were developed. Furthermore, new application possibilities were researched, such as magnetic cooling [Krenke, T. et al.: Nature Mat. 4, 450 (2005)].

The most important magnetic shape memory materials are Ni—Mn—Ga and Fe—Pd alloys. In the case of Ni—Mn—Ga, a shortening of the material along the direction of the applied magnetic field is achieved, while Fe—Pd shows an extension under the same conditions. The maximum strain is achieved only in single crystals, however.

Magnetic shape memory alloys are first of all also conventional thermal shape memory alloys [Otsuka, K., Wayman, C. M. (ed.) Shape Memory Materials (Cambridge University Press, Cambridge 1998)].

These materials have a martensitic transition from a cubic high temperature phase, the austenite, to a low-symmetrical low temperature phase, the martensite [Bhattacharya, K. et al.: Nature 428, 55 (2004)]. The martensite phase can have, e.g., a tetragonal unit cell with two "a" axes of identical length and a short "c" axis. Through the phase transition, various crystallographically well defined orientations of the martensitic unit cell are possible and thus a characteristic martensitic microstructure is produced in which variants of different crystallographic orientations are connected to one another by twin boundaries. Shape memory alloys that have a reversible martensite transition can be easily deformable. Thus with the application of a mechanical compressive stress, variants with the short crystallographic axis grow parallel to the stress axis at the cost of the variants of different orientations. In materials with a reversible martensitic transition, heating into the austenite phase restores the original shape again, since in the cubic phase all axes of the unit cell are identical. With several cycles exerting mechanical compressive stresses and heating, defects in the structure can be produced, which act as nucleation sites in the martensite formation. The structure can thus be reminiscent of the unequal distribution of the variants and thus the shape memory effect is produced. In this so-called thermal "two-way shape memory effect" the temperature is used as a control parameter.

Martensitic and ferromagnetic materials have common properties. For example, both material classes have respectively one characteristic order temperature. Below the martensitic transition temperature a parallel alignment of adjacent martensitic unit cells is favored, similar to a parallel alignment of magnetic moments below the Curie temperature. Magnetic shape memory alloys have therefore two so-called "ferroic" properties. They are martensitic and ferromagnetic. Different combinations of these ferromagnetic properties can be used for actor modi.

The first actuator mode is based on the coupling between crystal structure and spontaneous magnetization. In the magnetic field the phase with the higher magnetic moment is favored in terms of energy, which permits a shift of the martensitic transition temperature $T_M$ (Vasil'ev, A. N. et al.: Phys. Usp. 46 (6), 559 (2003); Cherechukin, A. A. et al.: Phys. Lett. A 291, 175 (2001)]. As also with well trained thermal shape memory alloys, this "magnetically induced martensite" (MIM) as actuator can be operated close to the martensitic transition temperature [Kainuma, R. et al. Nature 439, 957 (2006)]. The second actuator mode was observed in single crystals within the martensite phase. The so-called "magnetically induced reorientation" (MIR) is thereby used, also referred to as magnetic shape memory effect. In MIR the difference in the total energy, with alignment of the magnetization in different crystal directions, must be observed. This is described with the magnetocrystalline anisotropy energy [O'Handley, R. C. Modern Magnetic Materials (John Wiley & Sons, Inc, New York, 2000)]. The coupling between crystallographic orientation and the preferred direction of magnetization renders a change of the martensitic microstructure. A magnetic field can thus be used to move the twin boundaries such that the proportion of martensitic variants that have their energetically favorable easy magnetization axis parallel to the outer field increases. Since the lattice spacings of the martensitic unit cell are very different, this reorientation leads to a considerable change in length. MIR results in reversible, relative length changes of up to 10% [A. Sozinov, et al., Appl. Phys. Letters, Vol. 80, 1746 et seq. (2002)]. This results in advantages for the application of magnetic shape memory materials compared to the usual piezostrictive and magnetostrictive materials. An external magnetic field is used as a control parameter here. MIR itself has been described in WO 09808261 and WO 9703472. The production and use of magnetic field and strain sensors based on MIR is described in WO 03078922.

Actuators that use the principle of MIR are described in U.S. Pat. No. 6,515,382. This also discloses a valve in which a thin magnetic shape memory element is used as an active element (FIGS. 30-32).

Another approach to constructing thermally controlled microactuators from shape memory alloys is described by Kohl et al. [U.S. Pat. No. 7,142,341 A1]. Here the actuator element is heated above the Curie temperature so that there is no longer an active attraction to an additional permanent magnet. The decisive advantage of the approach claimed here is that this additional permanent magnet is no longer required to generate an external field.

Thin magnetic shape memory layers are of particular importance for microactuator applications, since the complexity of additional levers and additional mechanical components can be avoided due to the large relative strain.

Epitaxial layers are considered to be the most promising, since the largest strains so far have been achieved only in solid single crystals [Dong, J., et al.: Appl. Phys. Lett. 75 (10), 1443 (1999); Jakob, G. & Elmers, H. J.: J. Magn. Magn. Mater. 310 (2), 2779 (2007); Jakob, G., et al.: Phys. Rev. B 76 (17), 174407 (2007); Buschbeck, J., et al.: Phys. Rev. B 76, 205421 (2007)].

However, MIR has also been reported in orthorhombic, epitaxial Ni—Mn—Ga layers deposited on MgO (001) [Thomas, M. et al.: New J. Phys. 10, 023040 (2008)] and $SrTiO_3$ [Heczko, O., et al.: Appl. Phys. Lett. 92, 072502 (2008)]. A reorientation was observed although a macroscopic extension of the layer was prevented by the substrate. A low stress at the level of a few MPa leads to the blocking of MIR [Murray, S. J., et al., J. Appl. Phys. 89 (2), 1295 (2001)]. A detachment of the magnetic shape memory layers from the rigid substrate is therefore necessary in order to achieve an actuator effect on a macroscopic scale. Dong [Dong, J. W. et al. J. Appl. Phys. 95 (5), 2593 (2004)] reports on indications of length changes by MIR in the measurement of a free-standing bridge of an epitaxial Ni—Mn—Ga layer in the magnetic field. However, the effect was observed only considerably below room temperature.

By way of the so-called sacrificial layer technology, (in part) free layers, such as are required in positioning systems (U.S. Pat. No. 6,251,298 B1, U.S. Pat. No. 6,214,244 B1) or acceleration and position sensors (JP 11103076 A1, JP 11220135 A1) can be produced. This technology permits the production of completely or partially freestanding layers without having to dissolve the substrate itself. The completely or partially freestanding layers are instead produced by selective removal of the sacrificial layer inserted between the substrate and the functional layer. Si (A. Maciossek, et al., Microelectronic Engineering, Vol. 27, 503-508, (1995), porous Si (T. E. Bell, et al., J. Micromech. Microeng., Vol. 6, 361-369 (1996); US 2006 115 919 A1), Cu (S. D. Leith, et al., J. Micromech. Microeng., Vol. 9, 97-104 (1999)), Mg (E. K. Kim, et al. Thin Solid Films, Vol. 496, 653-657 (2006)) amorphous materials, such as $SiO_2$ (M. Lee et al., Thin Solid Films 447-448 (2004) 615-618), or also polymers, such as the polyimide (A. B. Frazier, et al., J. Microelectromech. Sys. 6 (1997) or water-soluble polyvinyl alcohol (PVA) can be used as sacrificial layers. PVA as a soluble substrate was used i.a. by Ohtsuka et al. to produce self-supporting Ni—Mn—Ga layers [Ohtsuka, M., et al., Mat. Sci. Eng. A 378 (1-2), 377 (2004)]. These layers have a strain of approx. 0.03% based on MIM. However, a subsequent heat treatment as well as a training were necessary for this.

It is relevant to the application to achieve a high relative length change which, in contrast to the absolute length change, is a length change normalized to the initial dimensions. The relative length change is often given as a percentage and is independent of the dimensions of the moveable magnetic shape memory element.

The disadvantage of the solutions of the prior art for magnetic shape memory alloys is that a magnetic field has to be generated for which complex coils systems and magnetic flux guides have to be used. This impedes in particular the integration into microsystems, since many production steps are necessary for the production of microcoils (Wurz, M. et al. IEEE Trans. Mag. 42 (2006) 2468).

It is also a disadvantage that with non-magnetic shape memory alloys, a complex thermomechanical training is required in order to achieve a reversible two-way actuator effect. In particular for integrated microsystems, this requires an additional expenditure that is usually not practical.

SUMMARY OF THE INVENTION

The present invention relates to a component of a ferromagnetic shape memory material in which a clearly greater relative length change occurs, and the use thereof.

Various features of the invention are disclosed and claimed herein. Advantageous embodiments are also disclosed and claimed herein.

The component according to the invention of at least one ferromagnetic shape memory material which has during a temperature cycle a martensitic phase transition and in the martensitic state a magnetic stray field energy reduced by variant selection, and which can be used without an additional external magnetic field and with which the variant selection is realized without a thermo-mechanical training of the shape memory effect, is produced by a method in which at least one sacrificial layer is applied on a single-crystalline or biaxially textured substrate, onto which an epitaxial or textured layer of a ferromagnetic shape memory material with a layer thickness of ≤50 μm is applied, subsequently the sacrificial layer is removed at least partially, and during or after the layer application a structuring at least of the ferromagnetic shape memory material is realized such that an aspect ratio is achieved in which at least one length is greater by at least a factor of 3 than the thickness of the layer or the shortest dimension of the component.

Advantageously, the ferromagnetic shape memory material is a Ni—Mn—Ga, Fe—Pd, Co—Ni—Ga, Ni—Fe—Ga and/or Co—Fe—Ga base alloy, wherein preferably up to 10 atomic % of other alloying elements are present, and even more advantageously up to 10 atomic % of W, Co, Mn and/or Ir are present as alloying elements.

Likewise advantageously, through the removal of the sacrificial layer, the structured epitaxial ferromagnetic shape memory material layer over at least 50% of its area has no non-positive connection to the substrate or another material, wherein advantageously the other material is a sacrificial layer or electrodes and also advantageously the other material has a lower strain than the ferromagnetic shape memory material.

Furthermore advantageously, there is essentially no direct connection between the structured epitaxial ferromagnetic shape memory material layer and a substrate or another material, wherein advantageously the other material is a sacrificial layer or electrodes, and also advantageously the other material has a lower elongation than the ferromagnetic shape memory material.

Also advantageously is an epitaxial or biaxially textured ferromagnetic shape memory material is present.

It is advantageous if the length and/or width of the structured layer of the ferromagnetic shape memory material is greater by at least a factor of 3 to 100 than the thickness of the layer.

It is likewise advantageous if the length and/or width of the structured layer has an extension of a maximum of 1 mm.

It is furthermore advantageous if the ferromagnetic shape memory material has a Curie temperature above the martensitic phase transition temperature.

Additionally, it is also advantageous if the sacrificial layer is composed of Cr, NaCl, Rh, Cu, Au, Pt, Pd, Ta, W or Ag.

It is also advantageous if buffer layers or further layers are arranged between the substrate and the sacrificial layer and/or between the sacrificial layer and the layer of the epitaxial ferromagnetic shape memory material.

And it is also advantageous if the layer thickness of the epitaxial ferromagnetic shape memory material layer is ≤20 μm, even more advantageously ≤1 μm.

It is likewise advantageous if on average there are no large-angle grain boundaries in the ferromagnetic shape memory material layer in a volume that is determined by the cross section multiplied by the minimum value of thickness or width.

It is furthermore advantageous if on average there is less than one non-pointlike defect at least in the epitaxial ferromagnetic shape memory material layer in a volume that is determined by the cross section multiplied by the minimum value of thickness or width.

Advantageously, source materials of the ferromagnetic shape memory material and coating media are used which have impurities of <1% by volume, even more advantageously <0.1% by volume.

Furthermore advantageously, the structuring is carried out by lithographic methods with the aid of light, electrons or x-rays.

Likewise advantageously, the application of the epitaxial ferromagnetic shape memory material layer is carried out at temperatures in the range of 0-800° C.

It is also advantageous if the application of a layer of a Ni—Mn—Ga base alloy is carried out at temperatures of 250 to 500° C.

It is likewise advantageous if the application of a Fe—Pd base alloy is carried out at a temperature of less than 300°.

And it is also advantageous if the component is composed of two bars or wires perpendicular to one another of a ferromagnetic shape memory material, which realize movements in two independent directions.

According to the invention, the component according to the invention is used as a microactuator or as a microsensor.

Advantageously, the component is used as a linear actuator, positioning system, optical component, y-x scanner or in stents.

Likewise advantageously, the component is used as a position sensor, length sensor or pressure sensor.

The invention also provides for a component comprising at least one ferromagnetic shape memory material, which has during a temperature cycle a martensitic phase transition and in a martensitic state a magnetic stray field energy reduced by variant selection, and which can be used without an additional external magnetic field and with which the variant selection is realized without a thermo-mechanical training of a shape memory effect, said component being produced by a method comprising applying at least one sacrificial layer onto a substrate, depositing a ferromagnetic shape memory material layer with a layer thickness of ≤50 μm, and after the depositing, at least partially removing the sacrificial layer, wherein the method results in said component comprising the at least one ferromagnetic shape memory material, which has during a temperature cycle a martensitic phase transition and in a martensitic state a magnetic stray field energy reduced by variant selection, and which can be used without an additional external magnetic field and with which the variant selection is realized without a thermo-mechanical training of a shape memory effect.

During or after the depositing, a structure results having at least one length that is greater by at least a factor of 3 than a dimension of the component. Wherein at least one of: the structure has an aspect ratio; and the dimension of the component comprises one of a thickness of the epitaxial or textured layer and the shortest dimension of the component. The structure is a structured epitaxial ferromagnetic shape memory material layer.

The substrate comprises one of a single-crystalline substrate and a biaxially textured substrate. The ferromagnetic shape memory material is an alloy of at least one of: Ni—Mn—Ga, Fe—Pd, Co—Ni—Ga, Ni—Fe—Ga, and Co—Fe—Ga. The component further comprise up to 10 atomic % of other alloying elements. The alloying elements comprise at least one of; W, Co, Mn, and Ir.

After the at least partially removing, a structured epitaxial ferromagnetic shape memory material layer results in which over at least 50% of its area it has no connection to one of the substrate and an other material. A structured epitaxial ferromagnetic shape memory material layer results in which over at least 50% of its area it has no connection to one of the substrate and an other material. The other material is one of a sacrificial layer and electrodes. The other material has a lower elongation than the ferromagnetic shape memory material.

The ferromagnetic shape memory material layer comprises one of an epitaxial textured ferromagnetic shape memory material layer and a biaxially textured ferromagnetic shape memory material layer. The ferromagnetic shape memory material layer comprises a structured layer of the ferromagnetic shape memory material. At least one of a length and a width of the structured layer of the ferromagnetic shape memory material is greater by at least a factor of 3 to 100 than a thickness of said structured layer. At least one a length and a width of the structured layer has an extension of a maximum of 1 mm.

The ferromagnetic shape memory material has a Curie temperature above a martensitic phase transition temperature. The sacrificial layer is composed of one of; Cr, NaCl, Rh, Cu, Au, Pt, Pd, Ta, W and Ag. The component further comprises one of buffer layers and additional layers arranged between at least one of the substrate and said sacrificial layer and said sacrificial layer and a layer of the epitaxial ferromagnetic shape memory material.

The layer thickness is ≤20 μm. The layer thickness is ≤1 μm. On average, there are no large-angle grain boundaries in the ferromagnetic shape memory material layer in a volume that is determined by a cross section multiplied by a minimum value of a thickness or a width of said ferromagnetic shape memory material layer. On average, there is less than one non-point-like defect at least in the ferromagnetic shape memory material layer in a volume that is determined by a cross section multiplied by a minimum value of a thickness or a width of said ferromagnetic shape memory material layer.

The ferromagnetic shape memory material layer is made of source materials or coating media having impurities of <1% by volume. The ferromagnetic shape memory material layer is made of source materials or coating media having impurities of <0.1% by volume.

The method utilizes lithographic methods comprising light, electrons or x-rays. The depositing is carried out at temperatures in the range of 0-800° C. The component further comprises applying a layer of a Ni—Mn—Ga base alloy at temperatures of between 250 to 500° C. The component further comprises applying a Fe—Pd base alloy at a temperature of less than 300°.

The component is composed of two bars or wires arranged perpendicular to one another and comprising a ferromagnetic shape memory material, and which can moves in two independent directions. The component is one of a microactuator and a microsensor. The component is one of a linear actuator, a positioning system component, an optical component, an y-x scanner component, and a stent. The component is one of a position sensor, a length sensor, and a pressure sensor.

The invention also relates to a component exhibiting a shape memory effect without thermo-mechanical training, wherein the component comprises at least one sacrificial layer arranged on a substrate, a ferromagnetic shape memory material layer having a layer thickness of ≤50 μm, and a portion of the at least one sacrificial layer being removed from an area between the substrate and the ferromagnetic shape memory material layer, wherein said substrate comprises one of a single-crystalline substrate and a biaxially textured substrate.

The invention also relates to a component exhibiting a shape memory effect without thermo-mechanical training and without an additional external magnetic field, wherein the component comprises at least one sacrificial layer arranged on a substrate and a structured epitaxial ferromagnetic shape memory material layer having a layer thickness of ≤50 μm, wherein said substrate comprises one of a single-crystalline substrate and a biaxially textured substrate.

BRIEF DESCRIPTION OF THE DRAWINGS

The invention is explained in more detail below based on several exemplary embodiments wherein they show.

DETAILED DESCRIPTION OF THE INVENTION

With the new component according to the invention of a ferromagnetic shape memory material there is for the first time a component the use of which does not necessitate either a training, such as is absolutely essential for conventional, non-magnetic shape memory alloys, or an additional external magnetic field. These previously essential requirements of the solutions according to the prior art prevented, in particular, the use of shape memory alloys in microsystems.

The solution according to the invention therefore realizes a new operating principle in that components of at least partially freestanding ferromagnetic shape memory materials through temperature change show a strain of the ferromagnetic shape memory materials with a clearly higher percentage and even into the range of the theoretically possible length change ranges. An at least partial release of the component according to the invention is necessary for this, since otherwise no length change can be realized.

This new operating principle is referred to below as stray field-induced microstructure (SFIM) and is explained and substantiated below.

Figure 1:
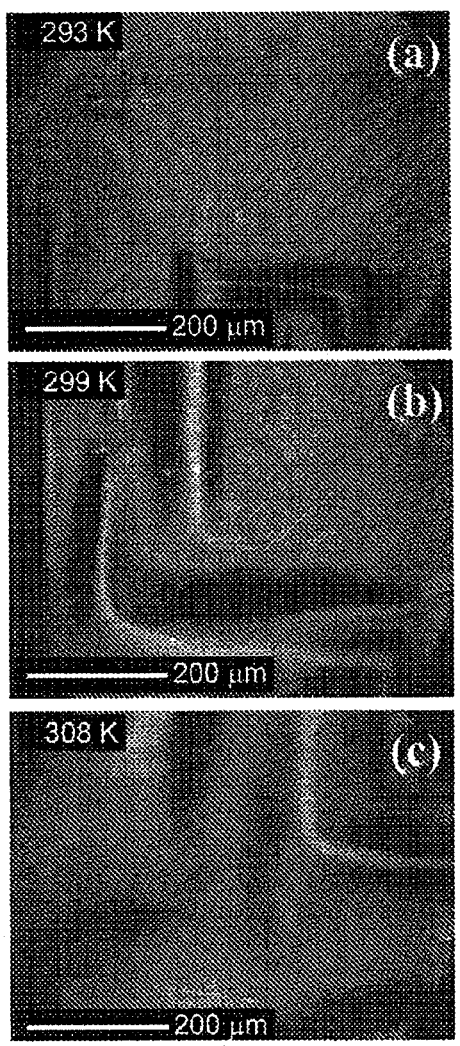
FIGS. 1a-c show a sequence of three exemplary images.

The expansion and contraction due to SFIM can be directly observed in-situ on an at least partially freestanding layer with the optical polarized-light microscope at different temperatures. A sequence of three exemplary images is shown in FIGS. 1a-c. A ferromagnetic shape memory material of Ni—Mn—Ga according to the invention was deposited as a layer onto a (001)-oriented NaCl substrate, which serves at the same time as sacrificial layer. This method was also used by Hakola et al. for the production of polycrystalline layers [Hakola, A., et al.: J. of Phys. 59, 122 (2007)]. After the dissolution of the substrate, there was a completely self-supporting layer of Ni—Mn—Ga. This material is present at the temperature of 293 K in the martensitic phase. The variants are visible as parallel or perpendicular bands. When the layer is heated, the twinned microstructure gradually disappears until the cubic austenite phase is completely formed. The layer undulates thereby due to its own extension. In order to show the intermediate state of the layer, an image at 299 K is shown. At 308 K the martensitic phase transition is completed. In order to achieve the martensitic state again, the layer must be cooled to below 289 K, since the thermal hysteresis of the martensitic phase transition must be overcome. The twin pattern after cooling is similar, but not identical to the variant distribution at the start of the thermal cycle.

Since no mechanical training is necessary with the solution according to the invention and would not be possible on thin, self-supporting layers with conventional methods, the observed expansion cannot be attributed to the conventional thermal two-way shape memory effect. Furthermore, no magnetic field was applied during the entire cycle, so MIM is also ruled out.

Further experiments at constant temperature in the martensite phase and with external magnetic fields up to 0.4 T showed no change in the microstructure. MIR is thus also ruled out as a further explanation.

The observation can thus not be assigned to the known effects.

Further tests were therefore carried out to prove the new operating principle. The formation of a stray field-induced microstructure (SFIM) was observed by way of x-ray diffractometry, magnetometry and polarized-light microscopy.

It was possible to establish by way of x-ray diffraction methods that the intensity of the austenite reflex is reduced since the volume percentage of the austenite is lower because of the external mechanical constrain now missing due to the freestanding layer. Compared to solid, stress-free samples, all of the variants do not occur with the same frequency, instead there is a clear asymmetry. Variants that are oriented with their c axis in the layer plane have a much higher frequency. This explains the lateral contraction of the layer in the transition to the martensite phase, since the c axis is shorter than the a axis. In order to explain this non-uniform distribution of the variants, the magnetic properties of the layer must be taken into consideration.

In order to determine the volume percentage of the variants lying in the layer plane with their "c" axis and the magneto-crystalline anisotropy, magnetization curves on the freestanding layer in the martensite were measured and compared to the curve for austenite. In the austenite phase the magnetization curve is closed and shows only a slight coercivity, which is usual for layers with a low magneto-crystalline anisotropy. When the layer is cooled in the martensite phase, the form of the magnetization curve changes substantially and at the same time the coercivity increases.

In conformity with variant distribution measured by x-ray diffractometry, two clearly different slopes of the magnetization curve result. These two slopes can be assigned to the different crystallographic orientations of the variants.

Figure 2:
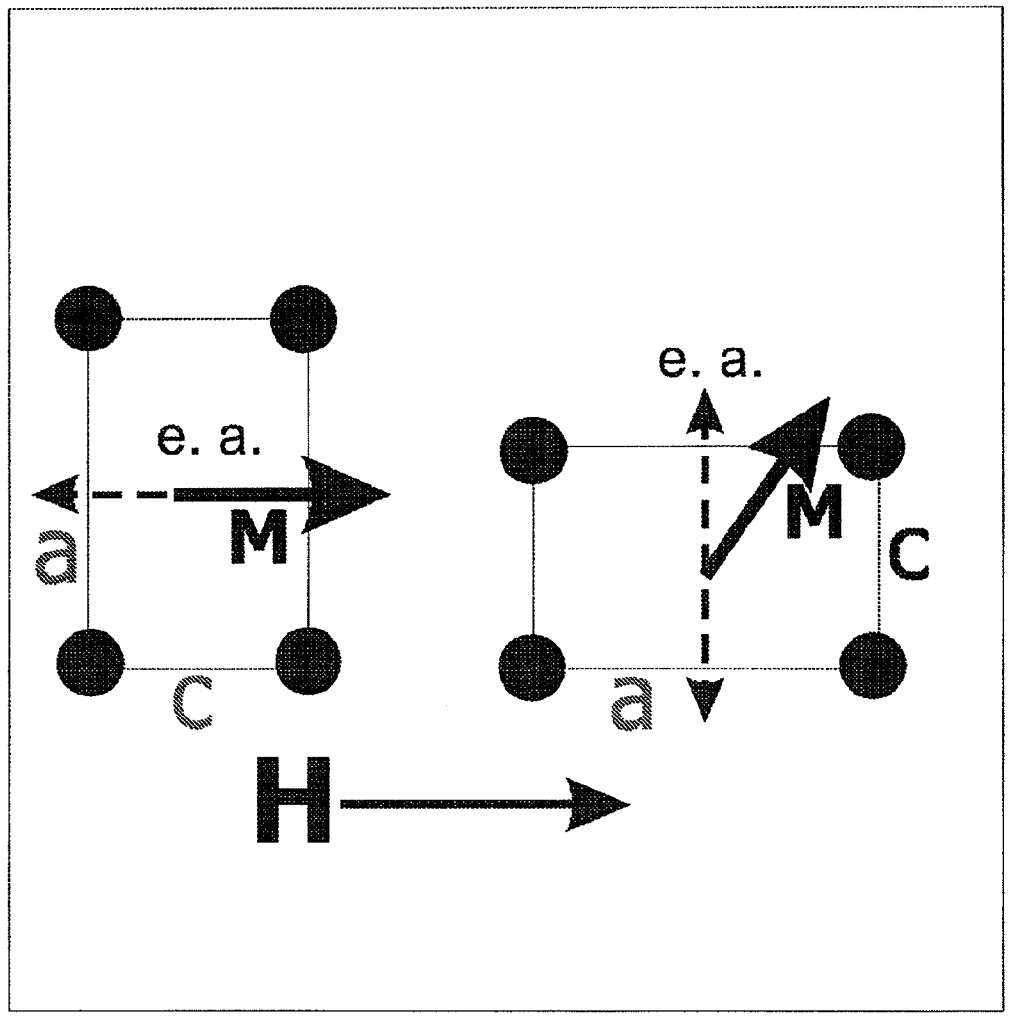
FIG. 2 shows diagrammatically the top view of the film plane with the two main orientations of the variants of both different orientations.
Figure 3:
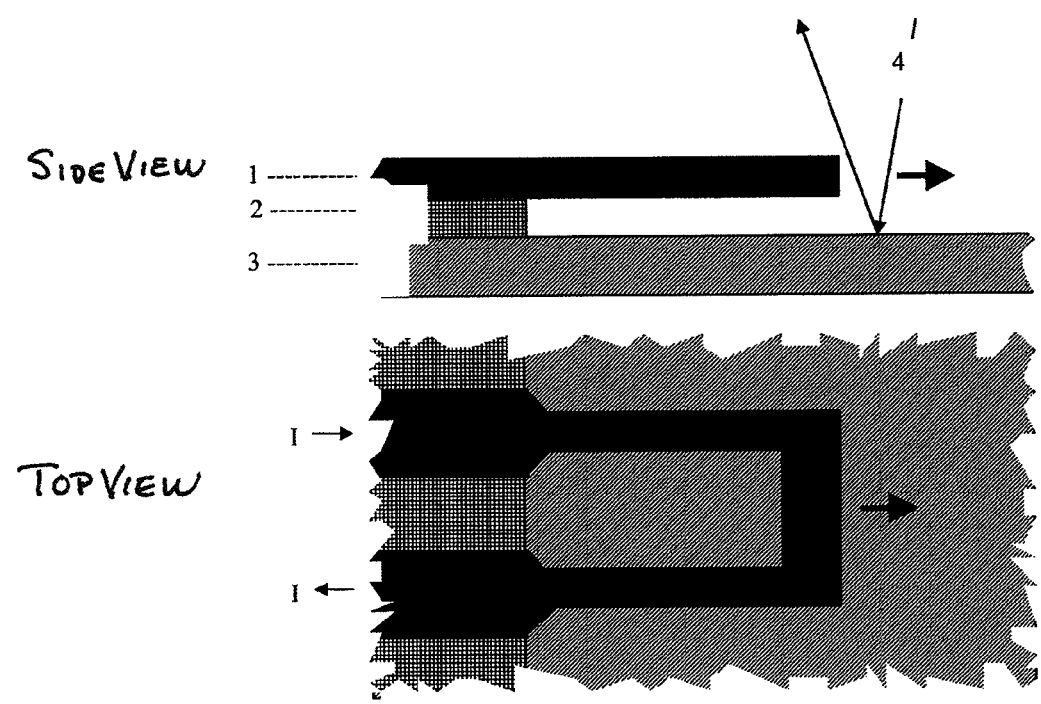
FIG. 3 shows a side view and a view from above of a component according to the invention.

FIG. 2 shows diagrammatically the top view of the film plane with the two main orientations of the variants of both different orientations. The short "c" axis coincides with the magnetically easy axis (e. a., dashed double arrow). With the application of the magnetic field H in the layer plane, the magnetization of the left variant is switched in the field direction, while the variant on the right side shows a continuous rotation of the magnetization towards the direction of the magnetically hard a axis. The low proportion of variants with their "c" axis perpendicular to the layer plane is not shown in the diagram.

The superposition of the behavior of the easy and the hard axis in the magnetization curve can be used for an estimate of the volume fractions of the differently oriented variants.

The proportion of the variants with an easy axis in the field direction is determined by extrapolation of the magnetization curve along the hard direction on 0 T. It was possible to establish that almost all variants lie with their easy "c" axis in the film plane and are equally distributed in both perpendicular equivalent plane directions. The equal distribution in the film plane is produced by the 4-fold symmetry of the substrate. Only a small proportion of the variants have their "c" axis perpendicular to the layer plane.

In order to explain the preferred orientation of the variants with their easy axis in the layer plane, a total energy examination must be carried out. Due to the magneto-crystalline anisotropy, an alignment of the magnetization in the direction of the easy "c" axis is preferred. Variants that have their "c" axis perpendicular to the layer plane therefore produce a magnetic stray field outside the layer and this costs additional free energy. An additional energy contribution however is not necessary for variants with their easy c axis in the layer plane. The upper limit for the stray field energy [O'Handley, R. C. Modern Magnetic Materials (John Wiley & Sons, Inc. New York, 2000)] can be determined by an examination of a single variant state with the "c" axis perpendicular to the layer plane in the single domain state. This energy is thus equal to the demagnetization energy density $k_D = \frac{1}{2} \times 1/\mu_0 \times J_S^2 = 1.9 \times 10^5$ J/m$^3$.

If the formation of magnetic domains with a magnetization direction perpendicular to the layer plane is taken into consideration [Hubert, A. & Schäfer, S. Magnetic Domains (Springer, Berlin 1998), 306 et seq.], this results in a lower and yet significant total energy contribution, $e_{tot} = 0.5 \times 10^5$ J/m$^3$, for the layer thickness of 0.5 μm taken as a basis. A reduction of the actuator size towards single domain particle size increases this energy [Hubert, A. & Schäfer, S. Magnetic Domains (Springer, Berlin, 1998), 306 et seq.]. This is a favorable scaling behavior in particular for nanoactuators, which also profit from the favorable surface to volume ratio, which allows rapid cooling.

The components of magnetic shape memory materials according to the invention can change their variant distribution in order to reduce their total energy. This is a possibility that does not exist in conventional magnetic layers.

In the event that no variants exist with their "c" axis perpendicular to the film plane and the magnetization lies in the layer plane, the contribution of the magnetic stray field energy is zero. For this configuration the maximum possible contraction of the layer can be determined from the different lattice spacings for martensite and austenite. The upper limit for the relative length change results as $\Delta l/l = 1 - \frac{1}{2}(a_M + c_M)/a_A = 1.1\%$, a considerably larger value than the length change that is obtained only from the change of the volume in the transition from the austenite to the martensite in the amount of 0.2%.

The approach with freestanding ferromagnetic shape memory materials presented here thus permits considerable advantages compared to the approaches previously known. The variants with their easy axis in the layer plane are preferably formed during the transition to the martensite phase, so that magnetic stray field energy can be avoided. This results in a reversible layer contraction of up to 1.1%, without an additional external magnetic field being necessary.

Both ferroic properties in the ferromagnetic shape memory materials of the components according to the invention are favorable for SFIM: in a conventional uniaxial ferromagnet there is no additional variance for the reorientation of the magnetically easy axis. In a non-magnetic martensitic film there is no magnetic stray field that leads to the avoidance of variants with a "c" axis oriented perpendicular to the layer plane. In addition, the instability at the martensitic phase transition is favorable for SFIM, so the variant distribution can be selected here more easily than with MIR.

For the production of the components according to the invention it must be ensured that the application of the ferromagnetic shape memory material layer can be carried out at different temperatures depending on the selected material and the deposition conditions. For example, for Ni—Mn—Ga a deposition temperature according to the invention of at least 300° C. is favorable, since the mobility of the atoms is sufficient for this material in order to heal defects.

Defects such as, e.g., grain boundaries, antiphase boundaries and impurities have an unfavorable effect, since the pinning of twin boundaries can considerably restrict their mobility. The variant orientation most favorable in terms of energy can hereby no longer occur, which in particular hinders to reach a minimal stray field energy. The critical number of defects can consequently be estimated for a typical actuator geometry, which is composed, for example, of a cantilever beam or several bars. The length change of the actuator component part usually takes place along its longest dimensions, which are referred to below as actuator direction. These considerations are based on a geometry in which the {001} planes of the austenitic elementary cell are oriented perpendicular to this actuator direction. In this geometry a maximum strain is achieved, since with all other orientations only the projection of the maximum lattice constant difference in the actuator direction with the sine of the angle between the actuator direction and adjacent direction contributes. Twin boundaries are {101} planes, i.e., they lie at an angle of approx. 45° to the actuator direction. Since a twin boundary represents a disturbance of the ideal crystal lattice, it requires additional free energy. Twin boundaries therefore align such that they require a minimal area. Twin boundaries thus extend over a characteristic length along the actuator direction which is determined by the minimum of width or layer thickness. If a defect acting as a pinning center is located in this volume [characteristic length (minimum width or thickness) times cross section], this volume fraction of the bar no longer makes any major contribution to the extension. Point like defects, such as, e.g., disturbances in the chemical order, do not act as efficient pinning centers and do not need to be taken into consideration in this estimate.

Therefore, there should not be any grain boundaries in this volume in particular. In post-deposition heat-treated and thus polycrystalline layers according to the prior art, the grain size increases with temperature and time, but a maximum grain size is often observed that is in the same order of magnitude as the layer thickness. Since grain boundaries act as efficient pinning centers, polycrystalline layers are not suitable for use as an actuator. According to the invention an epitaxial layer is therefore used. In epitaxial layers the orientation of the growing layer is determined by the single-crystalline substrate used and the epitaxial buffer layers optionally growing thereon. Through the orientation of the elementary cells of the layer predetermined hereby, epitaxial layers do not have any large-angle grain boundaries. Through the use of a substrate with a slight difference of the lattice constants and adequate deposition temperatures, the proportion of small-angle grain boundaries can also be greatly reduced.

With respect to the defects in the ferromagnetic shape memory material layer, such as, e.g., grain boundaries, antiphase boundaries and deposits, it should be said that according to the invention the critical number thereof, which have been introduced due to impurities of the source materials of the ferromagnetic shape memory material and coating media of a maximum of one percent by volume, must not be exceeded. Otherwise, twin boundaries can no longer move and the variant orientation cannot form that realizes an adequately low stray field energy.

With regard to the deposition temperature for the Fe—Pd system, a temperature around room temperature is more favorable. In this chemically disordered system, epitaxial growth is already achieved at room temperature. A deposition at higher temperatures is more unfavorable for this system, since in this system a segregation into a Fe-rich Fe(Pd) phase with cubic body-centered structure and $L1_0$-ordered FePd results.

In the case of the use of a Fe—Pd base alloy as a ferromagnetic shape memory material layer, the use of a rhodium layer as an additional sacrificial layer is favorable, since it can provide the epitaxial growth of Cr on Fe—Pd.

Through the realization of a geometry according to the invention of the component according to the invention, in which after the structuring of the epitaxial ferromagnetic shape memory material layer the length and/or width of the layer is larger at least by a factor of 2 than the thickness of the layer, which is to be no more than ≤50 μm, a magnetic shape anisotropy is realized.

This magnetic shape anisotropy in turn the alignment of the magnetization along the respective actuator direction is preferred. The magnetically easy axis, which in the case of Ni—Mn—Ga coincides with the crystallographically shorter axis, is aligned along the actuator direction hereby in the martensitic state.

No complex magnetic or complex mechanical components are necessary to use SFIM. Only a temperature cycle is necessary for a reversible actuator cycle. The temperature increase can be achieved, for example, in that an electric current is passed through the material, or the material is placed on a heatable substrate. The decrease in temperature can be produced via heat dissipation or heat emission into the environment.

Furthermore, in contrast to the conventional thermal two-way shape memory effect, no mechanical training is necessary. This is the key prerequisite for a use of the solution according to the invention in integrated microsystems and was not hitherto possible with conventional nonmagnetic shape memory alloys. SFIM will therefore allow the further miniaturization of the shape memory actuators down to the sub-micro scale, which is a much easier way to integrate these components.

Possible uses could be, for example, as a linear actuator, which can be used to shield a laser beam. Or actuators can be produced in which movements in more than one direction are possible, so that x-y scanners can be realized. Three-dimensional geometries can also be realized. It is likewise possible that the layers according to the invention of the epitaxial or textured ferromagnetic shape memory material can be used rolled up in a wire or tube form. The geometrically necessary conditions of the component according to the invention are also guaranteed in these forms. Thus currently used stents are usually based on shape memory wires. These can also be replaced by components according to the invention of ferromagnetic shape memory wires, and considerably larger strains are achieved even without prior training. Through a special arrangement of the wires, targeted, non-linear deformations can also be achieved.

A completely integrated microactuator can also be produced likewise according to the invention with thin layer techniques and a further reduction in the size of the structure is easily possible.

The component according to the invention can furthermore advantageously be used as a resetting mechanism, whereby the component can also be used as a sensor. The position, length or a pressure acting externally that leads to a shift in position of parts of the component can also be detected. The electric conductivity or magnetic variables, such as, e.g., the magnetic permeability, can here be used as a measured variable.

Example 1

A 4" Si substrate is used in which the natural oxide layer is removed by etching in hydrofluoric acid. The resulting hydrogen terminated surface is stable in air for up to 10 minutes, so that the substrate can be fed into the load lock of the UHV deposition system during this time. A Cr sacrificial layer with a thickness of 200 nm is applied onto this substrate such that it is epitaxially grown. Next a Ni—Mn—Ga layer with a thickness of 1 μm is epitaxially deposited on this sacrificial layer as an active material. Using photolithography the Ni—Mn—Ga layer is then structured in two bars of a length of 50 μm and a width of 10 μm in a component region of 50×50 μm, which are connected at one end with a further bar with a width of 10 μm and a length of 15 μm, so that later a U-shaped actuator can be produced. As the next step, those regions are covered with the photoresist in which the sacrificial layer is not to be removed. In the subsequent removal of the sacrificial layer by way of a mixture of perchloric acid ($HClO_4$), ammonium cerium nitrate $(NH_4)_2[Ce(NO3)_6$ and water in a mixture ratio of 10.9%:4.25%:84.85%, the bars are undercut and a freestanding "U" is produced, which at the open end is still non-positively connected to the sacrificial layer. The open ends of the actuator are used as electrodes so that no weakening effect at the connection of different materials occurs. It is advantageous when the power connections are designed to be wider, which reduces the electric resistance. This prevents a transformation into austenite from occurring in this region. A current is sent through the open ends of the U-shaped actuator, by which the actuator is heated and the material is thus transformed into the austenitic state. As described above, the austenitic state is laterally more extended than the martensitic state, i.e., with sufficient current passage, the actuator extends in the direction of the "U" and shields the laser beam. Due to the high surface area, the Ni—Mn—Ga layer cools down again quickly when the current is switched off and is transformed into the martensite. Without the action of an additional external magnetic field (that is, another magnetic field in addition to the terrestrial magnetic field), the stray field energy differs for different orientation of variants. Thus variants with a magnetically easy "c" axis with perpendicular orientation have a higher stray field energy than variants in which the "c" axis lies in the film plane. The proportion of "c" variants with perpendicular orientation thus decreases. Since the "c" axis is the shortest axis in Ni—Mn—Ga, this leads to a contraction. In contrast to conventional, nonmagnetic shape memory alloys, no training is necessary, i.e., a preferred variant distribution does not need to be adjusted by external mechanical forces. Through the contraction of the "U" the laser beam is released again and the actuator process can be repeated.

The advantage of this structure lies above all in the few component parts and that it can be produced using monolithic technology. Thus only two layer materials and two structuring steps are necessary. Heating with electric current permits an easy integration and control with conventional microsystem technology. An absolute length change of 0.5 μm is achieved due to the large relative strain of the effect, so that a plurality of systems can be realized on one chip.

Example 2

Figure 4:
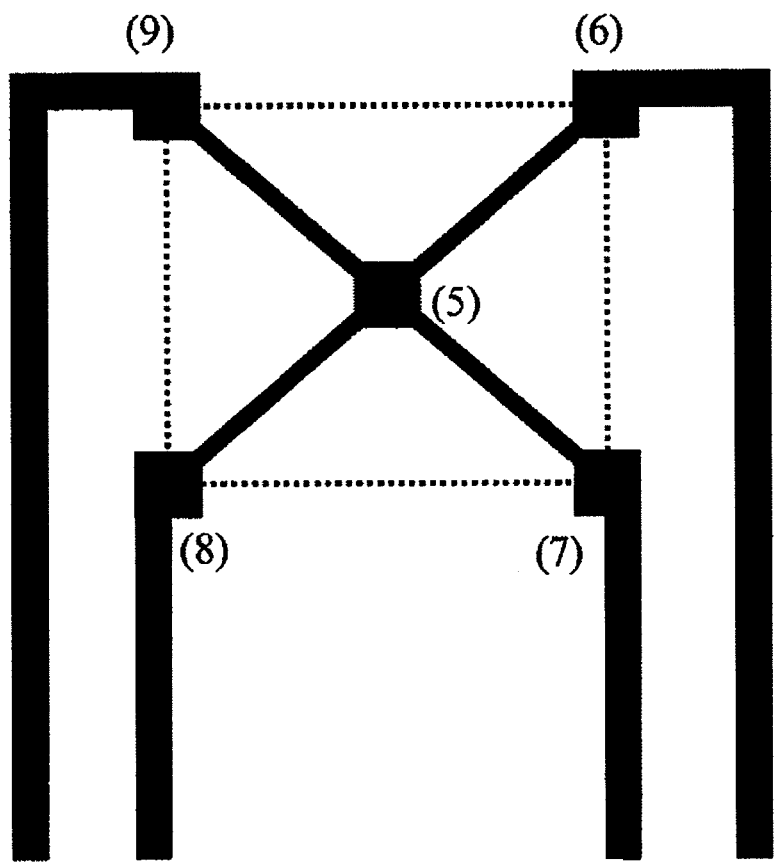
FIG. 4 shows a top view of a schematically shown x-y scanner.

As a further component, an x-y scanner is shown as a microactuator (see FIG. 4). The scan head 5 is here connected to 4 bars at the mounting points 6 through 9. These in turn are connected to one another via conductor paths that make it possible to heat these bars by applying a current.

To produce this x-y scanner, a GaAs substrate is used. A NaCl layer 200 nm thick is deposited onto this substrate by way of vapor deposition at 120° C., which layer later serves as the sacrificial layer. As the next step, a Ni—Mn—Ga layer 2 µm thick is deposited by way of sputter deposition at a substrate temperature of 300° C. as a ferromagnetic shape memory material layer, which due to the slight lattice constant difference from NaCl also grows epitaxially. The composition of the sputter target is selected such that the composition of the ferromagnetic shape memory material layer is $Ni_{50}Mn_{30}Ga_{20}$ and possible changes in the composition are compensated by evaporation and/or by non-stoichiometric transfer from the target to the substrate. This layer composition is ferromagnetic as well as martensitic at room temperature.

It was decisive for the selection of the deposition temperature that this temperature is sufficient to establish the $L2_1$ order in Ni—Mn—Ga and that this deposition temperature is considerably lower than the temperatures that are necessary in a two-stage process according to the prior art. In the two-stage process according to the prior art, deposition is carried out at room temperature and subsequently a heat treatment for order setting is carried out at above 600° C. With a deposition at room temperature, the Ni—Mn—Ga alloy is not chemically ordered and has a very small crystallite size. For these layers a heat treatment at considerably higher temperatures is necessary since vacancies first have to form in the volume, which then are necessary for diffusion.

If a single-stage process is realized, as according to the invention, i.e., the deposition on a heated substrate, the considerably faster surface diffusion already permits an order setting from 250° C. The maximum production temperature is automatically limited by the diffusion of Ga and As, which leads to unfavorable deposits in the Ni—Mn—Ga layer and thus to impurities and defect formations.

After the layer deposition, the structure shown by solid lines in FIG. 4 is produced in the Ni—Mn—Ga layer with conventional lithographic methods (structuring). As the next step, the layer is again covered with photoresist and only the shaded square is irradiated and in this region the photoresist removed. As the next step, the NaCl layer here is selectively etched with water. The etch time is hereby selected to be so long that all of the bars and the central scanner 5 are underetched. The component is hereby self-supporting and can move independently of the substrate. The geometry is selected such that with a bar width of 2 µm, the bar length at 10 µm is larger by a factor of 5 than the width of the layer.

To move the scanner head 5, a current is applied between the mounting points 6 and 7. Through the ohmic resistance and the resulting current flow, the bars heat up. If the austenite finish temperature is exceeded thereby, the material transforms into austenite with cubic structure and the bars lengthen. The scanner head hereby moves to the left from its previous position. Other directions of movement of the scanner head 5 or any combinations of these directions can be achieved by the selection of the current flow regarding direction and level. If the current flow is interrupted, the material cools down and below the martensite finish temperature, the material contracts again and moves the scanner head 5 back into the center position.

The change of the electrical resistance associated with the martensitic transformation can be used in turn to determine the current position of the scanner head 5. The same structure can thus also be used as position detector. Expediently a considerably lower voltage is hereby used so that a heating up of the bars is avoided.

The essential advantage of this x-y scanner compared to conventional solutions is the very small proportion of component parts and process steps. Thus only two layers and two lithographic steps are required. In particular no complex transfer from one component part to another substrate is required. Through the high metallic conductivity of Ni—Mn—Ga, in contrast to piezoceramic microactuators, low electric voltages of less than 5 V are sufficient. For an integration into mobile systems, this is an advantage, since in particular an integration of electronic and mechanical systems on one chip is possible.

LIST OF REFERENCE NUMBERS

1 Magnetic shape memory material layer
2 Sacrificial layer
3 Substrate
4 Laser beam
5 Scan head
6-9 Mounting points

The invention claimed is:

1. A component comprising at least one ferromagnetic shape memory material, which has during a temperature cycle a martensitic phase transition and in a martensitic state a magnetic stray field energy reduced by variant selection, and which can be used without an additional external magnetic field and with which the variant selection is realized without a thermo-mechanical training of a shape memory effect, said component produced by a method comprising:
   applying at least one sacrificial layer onto a substrate;
   depositing a ferromagnetic shape memory material layer with a layer thickness of ≤50 µm; and
   after the depositing, at least partially removing the sacrificial layer.

2. The component of claim 1, wherein, during or after the depositing, a structure results having at least one length that is greater by at least a factor of 3 than a dimension of the component.

3. The component of claim 2, wherein the structure has an aspect ratio; and the at least one length of the component is 3 times greater than a thickness of the epitaxial or textured layer and the shortest dimension of the component.

4. The component of claim 2, wherein the structure is made from an epitaxial or textured ferromagnetic shape memory material layer.

5. The component of claim 1, wherein said substrate comprises one of a single-crystalline substrate or a biaxially textured substrate.

6. The component of claim 1, wherein the ferromagnetic shape memory material is an alloy of at least one of: Ni—Mn—Ga, Fe—Pd, Co—Ni—Ga, Ni—Fe—Ga, and Co—Fe—Ga.

7. The component of claim 6, further comprising up to 10 atomic % of other alloying elements.

8. The component of claim 7, wherein the alloying elements comprise at least one of; W, Co, Mn, and Ir.

9. The component of claim 1, wherein, after the at least partially removing, a structured epitaxial ferromagnetic shape memory material layer results in which over at least 50% of its area it has no connection to one of the substrate and an other material.

10. The component of claim 1, wherein a structured epitaxial ferromagnetic shape memory material layer results in which over at least 50% of its area it has no connection to one of the substrate and an other material.

11. The component of claim 10, wherein the other material is one of a sacrificial layer and electrodes.

12. The component of claim 10, wherein the other material has a lower elongation than the ferromagnetic shape memory material.

13. The component of claim 1, wherein the ferromagnetic shape memory material layer comprises a structured layer of the ferromagnetic shape memory material.

14. The component of claim 13, wherein at least one of a length and a width of the structured layer of the ferromagnetic shape memory material is greater by at least a factor of 3 to 100 than a thickness of said structured layer.

15. The component of claim 13, wherein at least one a length and a width of the structured layer has an extension of a maximum of 1 mm.

16. The component of claim 1, wherein the ferromagnetic shape memory material has a Curie temperature above a martensitic phase transition temperature.

17. The component of claim 1, wherein the sacrificial layer is composed of one of; Cr, NaCl, Rh, Cu, Au, Pt, Pd, Ta, W and Ag.

18. The component of claim 1, further comprising one of buffer layers and additional layers arranged between at least one of:
    the substrate and said sacrificial layer; and
    said sacrificial layer and a layer of the ferromagnetic shape memory material.

19. The component of claim 1, wherein the layer thickness is $\leq 20$ μm.

20. The component of claim 19, wherein the layer thickness is $\leq 1$ μm.

21. The component of claim 1, wherein, on average, there are no large-angle grain boundaries in the ferromagnetic shape memory material layer in a volume that is determined by a cross section multiplied by a minimum value of a thickness or a width of said ferromagnetic shape memory material layer.

22. The component of claim 1, wherein, on average, there is less than one non-point-like defect at least in the ferromagnetic shape memory material layer in a volume that is determined by a cross section multiplied by a minimum value of a thickness or a width of said ferromagnetic shape memory material layer.

23. The component of claim 1, wherein the ferromagnetic shape memory material layer is made of source materials or coating media having impurities of <1% by volume.

24. The component of claim 1, wherein the ferromagnetic shape memory material layer is made of source materials or coating media having impurities of <0.1% by volume.

25. The component of claim 1, wherein the method utilizes lithographic methods comprising light, electrons or x-rays.

26. The component of claim 1, wherein the depositing is carried out at temperatures in the range of 0-800° C.

27. The component of claim 1, further comprising applying a layer of a Ni—Mn—Ga base alloy at temperatures of between 250 to 500° C.

28. The component of claim 1, further comprising applying a Fe—Pd base alloy at a temperature of less than 300°.

29. The component of claim 1, wherein the component is composed of two bars or wires arranged perpendicular to one another and comprising a ferromagnetic shape memory material, and which can moves in two independent directions.

30. The component of claim 1, wherein the component is one of:
    a microactuator; and
    a micro sensor.

31. The component of claim 1, wherein the component is one of:
    a linear actuator;
    a positioning system component;
    an optical component;
    an y-x scanner component; and
    a stent.

32. The component of claim 1, wherein the component is one of:
    a position sensor;
    a length sensor; and
    a pressure sensor.

* * * * *